(12) United States Patent
Greenlee et al.

(10) Patent No.: US 11,244,903 B2
(45) Date of Patent: Feb. 8, 2022

(54) TUNGSTEN STRUCTURES AND METHODS OF FORMING THE STRUCTURES

(71) Applicant: Micron Technology, Inc., Boise, ID (US)

(72) Inventors: Jordan D. Greenlee, Boise, ID (US); Christian George Emor, Singapore (SG); Travis Rampton, Meridian, ID (US); Everett Allen McTeer, Eagle, ID (US); Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 16/730,505

(22) Filed: Dec. 30, 2019

(65) Prior Publication Data
US 2021/0202388 A1    Jul. 1, 2021

(51) Int. Cl.
| | | |
|---|---|---|
| H01L 23/535 | (2006.01) | |
| H01L 21/768 | (2006.01) | |
| H01L 27/11582 | (2017.01) | |
| H01L 23/532 | (2006.01) | |
| H01L 27/11524 | (2017.01) | |

(Continued)

(52) U.S. Cl.
CPC ...... *H01L 23/535* (2013.01); *H01L 21/76805* (2013.01); *H01L 21/76816* (2013.01); *H01L 21/76876* (2013.01); *H01L 21/76895* (2013.01); *H01L 23/5283* (2013.01); *H01L 23/53257* (2013.01); *H01L 27/1157* (2013.01);
(Continued)

(58) Field of Classification Search
CPC ............. H01L 23/535; H01L 23/53257; H01L 21/76816; H01L 27/1157; H01L 27/11556; H01L 21/76876; H01L 23/5283; H01L 27/11582; H01L 21/76895; H01L 21/76805; H01L 27/11524
See application file for complete search history.

(56) References Cited

U.S. PATENT DOCUMENTS

| | | |
|---|---|---|
| 6,110,826 A | 8/2000 | Lou et al. |
| 6,310,300 B1 | 10/2001 | Cooney, III et al. |

(Continued)

FOREIGN PATENT DOCUMENTS

| | | |
|---|---|---|
| EP | 1094504 A2 | 4/2001 |
| KR | 100705936 B1 | 4/2007 |

(Continued)

OTHER PUBLICATIONS

U.S. Appl. No. 16/235,765, filed Dec. 28, 2018, Methods of Forming Tungsten Structures.
(Continued)

*Primary Examiner* — Shahed Ahmed
*Assistant Examiner* — Vicki B. Booker
(74) *Attorney, Agent, or Firm* — Schwegman Lundberg & Woessner, P.A.

(57) ABSTRACT

Described are methods for forming a tungsten conductive structure over a substrate, such as a semiconductor substrate. Described examples include forming a silicon-containing material, such as a doped silicon-containing material, over a supporting structure. The silicon-containing material is then subsequently converted to a tungsten seed material containing the dopant material. A tungsten fill material of lower resistance will then be formed over the tungsten seed material.

24 Claims, 4 Drawing Sheets

(51) Int. Cl.
*H01L 27/11556* (2017.01)
*H01L 27/1157* (2017.01)
*H01L 23/528* (2006.01)

(52) U.S. Cl.
CPC .. *H01L 27/11524* (2013.01); *H01L 27/11556* (2013.01); *H01L 27/11582* (2013.01)

(56) References Cited

U.S. PATENT DOCUMENTS

| | | |
|---|---|---|
| 6,579,788 B1 | 6/2003 | Jones et al. |
| 6,734,097 B2 | 5/2004 | Iggulden et al. |
| 7,666,785 B2 | 2/2010 | Sung et al. |
| 7,830,016 B2 | 11/2010 | Meldrim et al. |
| 10,847,367 B2 | 11/2020 | Economy et al. |
| 2002/0048938 A1 | 4/2002 | Ishizuka et al. |
| 2006/0063025 A1 | 3/2006 | Huang et al. |
| 2008/0089111 A1 | 4/2008 | Lee et al. |
| 2008/0237798 A1 | 10/2008 | Lee et al. |
| 2008/0247214 A1 | 10/2008 | Ufert |
| 2008/0248327 A1 | 10/2008 | Huang et al. |
| 2009/0142925 A1 | 6/2009 | Ha et al. |
| 2009/0321943 A1 | 12/2009 | Meldrim et al. |
| 2014/0154883 A1* | 6/2014 | Humayun ......... C23C 16/45525 438/675 |
| 2018/0076032 A1 | 3/2018 | Wang et al. |
| 2020/0211843 A1 | 7/2020 | Economy et al. |
| 2021/0183651 A1 | 6/2021 | Economy et al. |

FOREIGN PATENT DOCUMENTS

| | | |
|---|---|---|
| WO | WO-2016085572 A1 | 6/2016 |
| WO | WO-2020139632 A1 | 7/2020 |

OTHER PUBLICATIONS

"International Application Serial No. PCT/US2019/066919, International Preliminary Report on Patentability dated Jul. 8, 2021", 9 pgs.
"International Application Serial No. PCT/US2019/066913, International Search Report dated Apr. 22, 2020", 3 pgs.
"International Application Serial No. PCT/US2019/066919, Written Opinion dated Apr. 22, 2020", 6 pgs.
U.S. Appl. No. 17/216,264, filed Mar. 29, 2021, Memory Device Including Control Gates Having Tungsten Structure.
U.S. Appl. No. 17/216,210, filed Mar. 29, 2021, Memory Devive Including Control Gates Having Tungsten Structure.

* cited by examiner

TUNGSTEN STRUCTURES AND METHODS OF FORMING THE STRUCTURES

TECHNICAL FIELD

Embodiments described herein relate generally to manufacturing of tungsten structures of microelectronic devices, such as tungsten structures on a semiconductor die; and more particularly relate to methods of forming such tungsten structures having desired electrical characteristics, and to the resulting structures.

BACKGROUND

Microelectronic devices are ubiquitous in daily life. A continuous demand exists for miniaturization and reduction of power requirements, but also for increased processing power and speed. With these competing demands, the complexity and density of the underlying circuitry grows, along with the complexity of manufacturing processes to form such circuitry. As the density of structures forming such circuitry increases, with the result of the dimensions of individual conductive structures shrinking, manufacturing conductive structures with acceptable electrical properties becomes increasingly challenging.

Examples of such microelectronic devices include semiconductor structures (such as semiconductor devices formed on a semiconductor substrate (termed "semiconductor die")), as well as circuit components and interconnections that may be formed over interposers and/or other non-semiconductor substrates. Semiconductor structures include semiconductor, dielectric, and conductive elements, all patterned to form circuit components and desired interconnections between the circuit components. The conductive structures are often formed from one or more metals or metal-containing materials.

However, the resistance of conventionally-formed conductive structures generally increases as the dimensions of the structures are reduced, potentially complicating the manufacture of semiconductor structures with necessary electrical properties. Such increasing resistance thus may cause more exotic materials or processing methods to be used, or new complex device designs to be developed, to form structures with suitable electrical properties and/or to diminish the effects on circuit function from conductive materials formed at the reduced dimensions.

DESCRIPTION OF EMBODIMENTS

Figure 1:
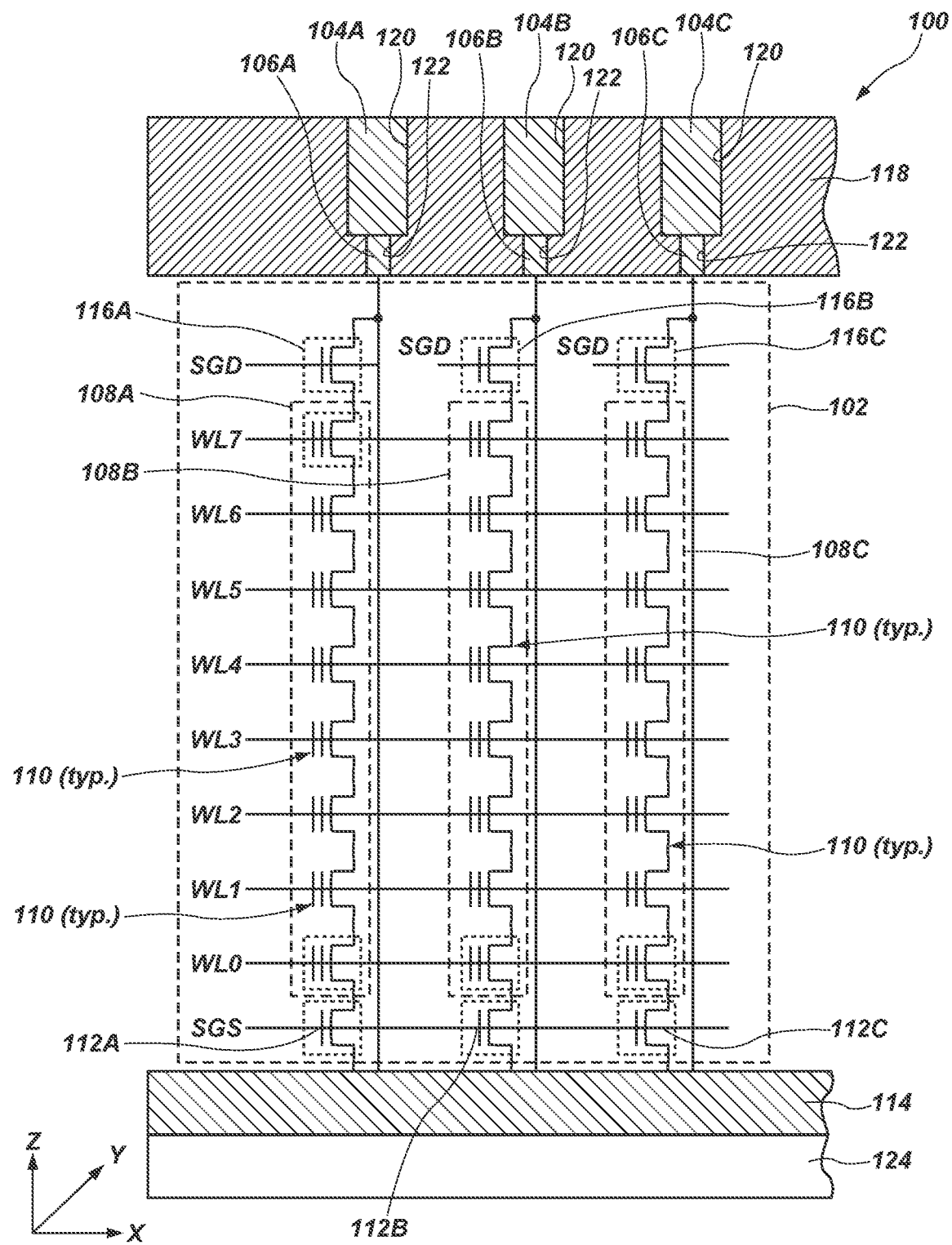
FIG. 1 depicts a representative portion of a memory device depicting an example environment in which the disclosed techniques may be utilized; in which an example portion of a memory cell array is depicted within dashed lines (indicating an optional structure), with physical structures of a memory device depicted above and below the example memory cell array, and shown in vertical section.

The following description and the drawings illustrate specific structures and processes to enable persons skilled in the art to make and use the structures and processes. The described structures and processes are examples only, and other embodiments implementing the teachings herein may incorporate structural, logical, electrical, process, and other changes from the examples provided herein. Portions and features of some embodiments may be included in, or substituted for, those of other embodiments.

The description below addresses example embodiments useful for forming relatively low resistance tungsten structures. Additionally, the described methods may be implemented in a manner to provide improved step coverage in smaller features, and thus can provide particular advantages in forming such tungsten structures in high aspect ratio recesses. As described below, described examples include forming a silicon-containing material on a supporting structure, which may be within such a high aspect ratio recess (as described further later herein), through processes facilitating desirable step coverage, such as atomic layer deposition (ALD) or chemical vapor deposition (CVD). The silicon-containing material is then subsequently converted to a tungsten seed material. As described below the silicon-containing material will preferably include a dopant that will be present in the converted tungsten seed material, and which will inhibit nucleation in a subsequently deposited tungsten fill formed on the tungsten seed material. Additional details and examples will be set forth below.

As the dimensions of conductive structures using conventional materials in semiconductor devices decreases, reaching 20 nm and below for example, the resistance of conventionally-formed conductive materials typically increases. In some applications, in which longer conductor lengths are needed, at reduced dimensions, the increased resistance may preclude the use of otherwise preferred conductive materials.

While tungsten structures have been favored for providing relatively low resistance conductive elements, such as, for example, for relatively longer length conductive structures, as well as vias and interconnects, tungsten also is affected by increased resistance at reduced dimensions. All tungsten structures, however, are not the same, and tungsten structures have different electrical characteristics, such as resistance/conductivity, based upon the specific characteristics of the tungsten material forming the structure.

An example characteristic of tungsten material impacting the resistance of tungsten material includes the crystalline phase of the material (alpha-phase or beta-phase), of which alpha-phase presents lower resistivity. Alpha phase tungsten is the more stable phase, and has a body centered cubic ("bcc") lattice (which in some examples may include, for example, a cubic crystalline structure having a space group of Im-3m (body centered Bravais lattice with 3m symmetry elements) and 2 atoms/unit per cell. Beta phase tungsten is a different cubic crystalline structure, sometimes described as an "A15" structure (which some examples may include, for example a space group of Pm-3n (primitive with 3n symmetry elements) and 8 atoms/unit per cell.

The crystal structure of the deposited tungsten material can be detected by a transmission electron microscopy (TEM), through crystal orientation and phase mapping techniques. Alternatively, electron nanodiffraction, such as may be performed through use of a scanning transmission electron microscope, may be used to identify different X-ray diffraction ("XRD") signals of the different tungsten phases, which can identify crystalline phase and structure of a deposited material. In some examples, the XRD peak ratios can be used to identify the relative amounts of alpha-phase and beta-phase tungsten.

The resistivity of the alpha-phase tungsten is further dependent on the grain size of the alpha-phase tungsten material (in which larger grain size is associated with greater conductivity/lower resistivity). The present disclosure addresses various embodiments for forming conductive structures of tungsten in a manner to form tungsten structures with a predominance of alpha-phase material, under conditions which offer improved conductivity relative to conventionally-formed tungsten structures. In discussing grain size of the alpha-phase tungsten material, person skilled in the art will recognize that the grains will often be irregularly shaped. Accordingly, grain sizes discussed herein are relative to the maximum (i.e. longest) dimension through individual grains; and the discussion herein addresses such maximum dimension as being "at least" of an identified reference value, to distinguish smaller grains in which the maximum dimension is less than the identified reference value.

In the described examples, the tungsten structures are formed over a substrate. In the described example processes, tungsten fill is formed over a tungsten seed material, of which a majority, by volume is beta-phase tungsten. In some processes, the tungsten seed material is formed by reduction of a silicon-containing film including a dopant, as described in more detail below. The dopant in the silicon-containing film is selected to promote formation of a predominance of beta-phase tungsten in a tungsten seed material formed from the silicon-containing film. The tungsten seed material having a majority composition of beta-phase tungsten promotes the forming of a predominance of relatively large-grained alpha phase tungsten in a subsequently formed tungsten fill material formed on the tungsten seed material.

As a result, the dopant in the silicon-containing material will be selected to inhibit nucleation of subsequently formed tungsten fill material to promote large grains and alpha phase tungsten in the fill material when formed on the tungsten seed layer formed from the silicon-containing material. The nucleation-inhibiting properties need not necessarily exist in the silicon-containing material, but may only be a property of the subsequently-formed tungsten seed layer at the time when the tungsten fill is formed over the seed layer. As a result, the dopant in the silicon-containing material that acts as a nucleation-inhibiting material in the formed tungsten seed material may be present in different forms. For example, the nucleation-inhibiting material in the silicon-containing film may be present in the tungsten seed layer as a dopant of the tungsten; while in other examples the nucleation-inhibiting material may be alloyed with the tungsten.

In some embodiments, the composition of the tungsten seed material, and the inhibition of nucleation of the tungsten fill material (the fill material forming the bulk of the conductive structure), will also result in a majority of the tungsten fill material being formed of larger grains (e.g., in some examples, having a maximum dimension about 50 nm or greater, with some examples including grains having a maximum dimension of at least about 80 nm, and in some examples of at least about 100 nanometers). For some examples, the tungsten fill material having grains having a maximum dimension in excess of about 50 nm may form at least about 50% or greater of the tungsten fill material. In other examples, tungsten fill material having grains with a maximum dimension of 50 nm may offer beneficial electrical properties if present in only about 40% of the tungsten fill material. The term "about" herein is meant to include a variance of ±10 percent of the structure or characteristic to which it is applied, to provide for variances of manufacturing processes, measuring techniques, etc.

For purposes of the present description, the described forming of a "tungsten seed layer" is used to describe the forming a structure having both tungsten and a nucleation-inhibiting material. The term "seed layer" does not imply any form in which either material is formed (i.e., the materials may be deposited in a form other than what persons skilled in the art might consider a "layer"; and except as expressly noted herein, the term "layer" herein does not imply any degree of uniformity, or of contiguous coverage of an underlying support structure on which the material of the "layer" is formed). For example, the tungsten seed layer may or may not be present as a film (for example having a dimension of 10 nm or less); and may not necessarily cover the entirety of an underlying support surface over which the tungsten fill will be formed.

As discussed in more detail below, the supporting surface can be of various materials and configurations. One example configuration that may be used is one in which the supporting surface is a surface defining, at least in part, a recess in a structure. For example, the supporting surface may be defined, at least in part, by a dielectric layer, and the recess may be a trench through which an elongated conductive line is to be formed.

One example application in which elongated relatively high conductivity tungsten structures are beneficial is in memory structures. In memory, conductive lines such as word lines and bit lines, as well as source conductors (which may be in the form of source lines), typically extend across substantial portions (or all) of a memory array. While tungsten has often been a preferred material for at least some of these lines, use of conventionally-deposited tungsten can yield less than optimal electrical characteristics in structures of reduced dimensions. Additionally, an increasing number of memory structures are 3D memory structures, in which multiple levels of memory cells extend vertically above a substrate. As the pitch and feature size of memory cells is reduced, more structures, including for example, conductive lines, must also be of reduced lateral dimension, and therefore of increased vertical dimension to provide a desired cross-sectional area. As a result, more structures are formed with higher aspect ratios of the vertical dimension to the lateral dimension (for example of at least 2:1, but in some cases, for example of 20:1, with aspect ratios of 50:1 and even 100:1 currently being considered). In many examples, lateral dimensions for such conductive structures will be 40 nanometers or less, and in some current examples between 7 nanometers and 10 nanometers, though the feature dimension is continually being reduced, as processes and material properties allow. The vertical and lateral dimensions of elongated conductive structures (i.e. dimensions as seen in a vertical cross-section) can, in some examples very over the length of such structures.

Microelectronic devices can include multiple structures potentially benefiting from relatively low resistance tungsten conductive lines and structures, including structures on a semiconductor die, as well as on package substrates, interposers, redistribution layers, etc. For purposes of the present disclosure, the term "substrate" will be used to identify any structure for inclusion in a microelectronic device over which the described tungsten structures will be formed (which may be, for example, a semiconductor wafer, an individual semiconductor die, interposers, laminated or build-up structures etc. (as discussed above).

For purposes of the examples herein, the substrate is described in the context of a semiconductor substrate (for example, a substrate of a semiconductor die). As a result, the substrate semiconductor material (termed herein, a "wafer" during a manufacturing process) may be, for example, silicon (Si), germanium (Ge), or a compound semiconductor such as silicon carbide (SiC), silicon-germanium (SiGe), a III-V semiconductor (e.g., gallium arsenide (GaAs) or indium phosphide (InP) or ternary/quaternary semiconductors), or other semiconductor materials known to persons skilled in the art. Alternatively, the substrate may include other semiconductor-supporting technologies including, for example, silicon-on insulator (SOI), silicon-on sapphire (SOS), epitaxial layers of silicon supported by a base semiconductor structure foundation, and other structures known to persons skilled in the art.

FIG. 1 depicts a representative portion of a memory device 100, depicting an example memory array 102 represented in schematic form, with simplified representative structures, as may be formed through use of the described techniques, above and below the example memory array 102. Above memory array 102, multiple data lines 104A-C extend generally along the indicated Y-axis, each data line 104A-C coupled to a respective depicted memory cell string 108A-C. In the depicted examples, contacts 106A-C extend between each data line 104A-C and a respective depicted memory cell string 108A-C. In the example configuration of FIG. 1, while each data line 104A-C extends in the Y direction, contacts 106A-C extend downwardly only at selected locations along the length of data lines 104A-C. The example structure is illustrative only, to indicate one of many optional configurations, in which conductive structures include a horizontally extending conductor (data lines 104A-C) connected to locally-placed contacts (106A-C).

Example memory array 102 is provided as an example configuration of many possible memory array configurations, to demonstrate an example context in which tungsten structures as described herein are useful. The described tungsten structures are useful with essentially any form of memory structure, regardless of the memory cell storage technology implemented; and the described tungsten structures are useful in non-memory semiconductor devices and structures. Just a few examples of memory structures which may benefit from the described tungsten structures are memory structures implementing any of a variety of storage technologies such as dynamic random access memory (DRAM), synchronous dynamic random-access memory (SDRAM); flash memory (e.g., NAND or NOR flash), electrically erasable programmable ROM (EEPROM), static RAM (SRAM), Ferroelectric RAM (FeRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

The example memory array 102 is a 3D NAND memory array, in which each memory cell string 108A-C, includes multiple serially connected charge storage memory cells, Indicated generally, and typically, at 110 (not all memory cells are labeled, for clarity); with a respective select gate source (SGS) device 112A-C on a first side of the serially connected charge storage memory cells 110A-C (in this example, below the charge storage memory cells), to selectively connect material forming a channel of the serially connected memory cells to a source 114; and a respective select gate drain (SGD) device 116A-C on the opposite side of the serially connected charge storage memory cells (in this example, above the charge storage memory cells), to selectively connect the channel-forming material forming to a respective data line 104A-C. In the depicted example, the charge storage memory cells may be floating gate memory cells or may be charge trap memory cells. The serially-connected charge storage memory cells can be formed, at least in part, in respective vertically-spaced conductive levels separated from one another by dielectric levels. In many examples, some vertically-spaced conductive levels (those in which memory cells are formed) will form word lines which include control gates for multiple laterally-disposed memory cells. As a result, multiple vertically-arranged tiers of memory cells are present, with multiple memory cells within a respective tier coupled to a word line of that tier, as indicated generally at WL0-WL7 in example memory array 102

In selected examples, the tungsten structures as described herein may be utilized for one or more of the source 114, the data lines 104A-C, the contacts 106A-C, and the word lines (WL0-WL7). In many memory structures, a source conductor (114) will be configured to extend across a memory array, or a portion thereof; as will data lines (104A-C); though in some examples, they may extend across different dimensions of the memory array, or portions thereof (as depicted in the present example in which the source extends relative to the indicated X-axis, and the data lines extend relative to the indicated Y-axis).

In example memory device 100, source 114 may be formed over a substrate 124. For example, source 114 may be formed at least partially within a semiconductor material of the substrate (for example, a semiconductor wafer), such as extending at least in part within a recess in a substrate material. Alternatively, source 114 may be formed, at least partially, in one or more materials formed over that substrate material. When source 114 extends at least partially within a substrate material, such as within a trench within the substrate material, a dielectric may be used to isolate the conductive material of the source from the surfaces of the substrate material defining the trench.

Also in example memory device 100, a dielectric level 118 extends above the memory array 102 and supports data lines 104A-C, and contacts 106A-C. The term "level" is used herein to identify the presence of a structure which may be a single material, or multiple materials. For example, dielectric level 118 may be formed of a single dielectric material or of multiple dielectric materials.

In an example configuration, dielectric level 118 may be deposited, and then patterned to define trenches 120, which will respectively contain data lines 104A-C, and where desired, openings 122 extending beneath a lower surface of trenches 120 at selected locations along the length of trenches 120, which will respectively contain contacts 106A-C coupling to conductive (or semiconductive) structures within memory array 102. As will be apparent to persons skilled in the art having the benefit of this disclosure, trenches 120 may be high aspect ratio recesses, and contacts 106A-C may also individually represent high aspect ratio recesses, though in the depicted example having a smaller lateral dimension than trenches 120. In some memory devices both the source (114) and the data lines (104A-C) may be located either above the memory array or below the memory array. In such configurations, both the source and the data lines may be supported by vertically offset dielectric levels, as will be apparent to persons skilled in the art having the benefit of this disclosure.

Referring now to FIGS. 2A-E, the figures depict a simplified cross-sectional representation of a semiconductor device substrate 200, at representative stages of forming tungsten structures. The term "semiconductor device substrate" is used herein to identify the structures present at any of the multiple stages of forming a semiconductor device. Semiconductor device substrate 200 includes a substrate 202, which may be a semiconductor material or other structure, as discussed above. One or more material levels will be formed over substrate 202. In the depicted example, a first level 204 is depicted as formed on substrate 202, while additional levels may be formed over level 204 in the region 206 indicated by dashed lines. In semiconductor device substrate 200, a dielectric level 208 is formed over substrate 202. Dielectric level 202 may be separated from substrate 202 by many material levels. For example, dielectric level 208 could, in some examples, correspond to dielectric level 118 above memory array 102 in example memory device 100 of FIG. 1. As another example, dielectric level 208 be formed closer to substrate 202, such as to support source 114 below memory array 102 in example memory device 100.

Dielectric level 208 has been patterned to define a vertical recess (for example, a trench or via) that will define a path in which tungsten will be formed. For purposes of the present discussion, the vertical recess will be considered as a longitudinally extending recess along an axis perpendicular to the surface of the figure, and will be described herein as "trench 210." However, in other examples, vertical recess may have, for example, constrained dimensions if viewed in a horizontal plane (for example, a generally cylindrical or oval horizontal cross-section) defining a via suitable for housing a contact structure (such as depicted at 106A-C in memory device 100 of FIG. 1). In some example implementations, trench 210 may be formed with a depth of about 50-200 nm, and may be of about 10 nm to 40 nm in width. Other implementations may include recesses, shallower or deeper, and/or narrower or wider. Accordingly, the identified dimensions are provided as examples only, to provide context for the present description. The vertical recess, in whatever form, and of whatever dimensions, may be formed by conventional photolithographic and etching techniques known to persons skilled in the art.

In the depicted example, dielectric level 208 is depicted as a single material defining both the sidewalls 212 of trench 210, as well as the bottom surface 212 of trench 210. In other examples, dielectric level 208 may be formed of multiple dielectric materials, for example a first dielectric material 216 extending horizontally in a first region (as depicted below dashed line 230) and defining bottom surface 214 of trench 210, with a second dielectric material 218 formed on the first dielectric material 216 and defining sidewalls 212. Dielectric level 208 may be formed of more than two materials, which may be allocated differently than in the described alternative. Accordingly, dielectric level 208 may be formed of one or more grown or deposited insulative materials. In some examples, the material(s) will include silicon nitride (SiN) and/or silicon oxide (SiO2), or may include other types of nitrides and/or oxides. For example, dielectric level 208 may include one or more high-K dielectric materials, for example a high-k oxide (for example, zirconium oxide or hafnium oxide) rather than, or in addition to, SiO2. As used in the industry, a high-k dielectric is one having a relative dielectric constant greater than that of silicon oxide (3.9).

Figures 2A, 2B:
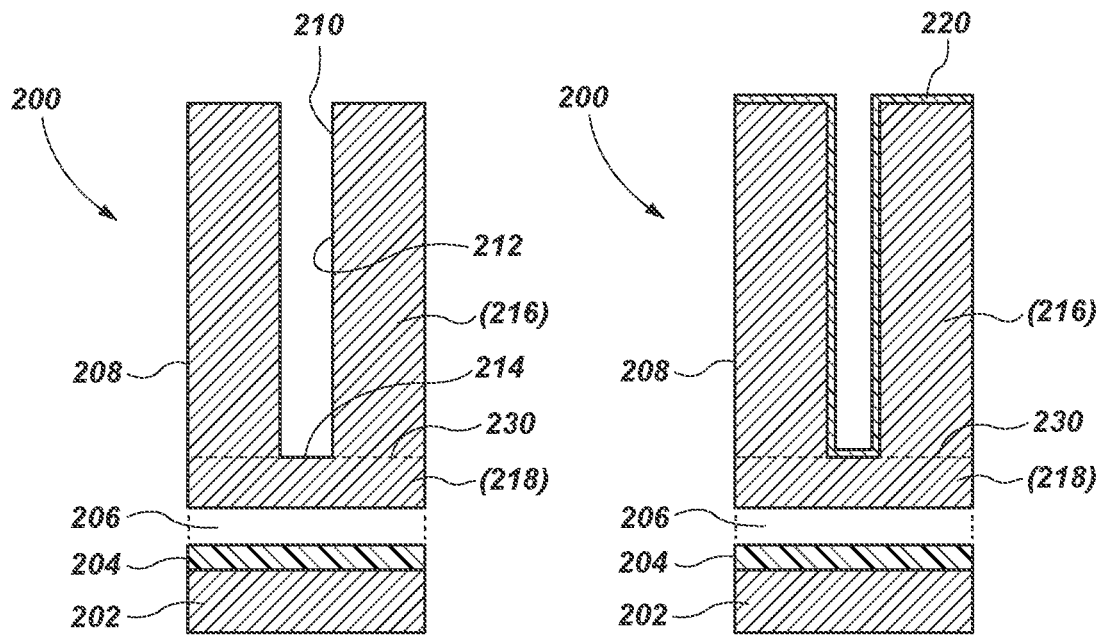
FIG. 2A-2F depict simplified cross-sectional representations of a representative portion of an example semiconductor die incorporating tungsten conductive structures during representative stages of an example manufacturing process.

Referring now specifically to FIG. 2B, a doped silicon-containing material, indicated generally at 220 is formed within trench 210. "Doping," as used herein, is the intentional introduction of impurities into the base material to modulate the properties of the base material. Doping may occur at the time of deposition, or after the tungsten has been deposited. The doped silicon-containing material will eventually be converted ("reduced") to a tungsten seed layer, as described below. In various examples, the dopant may include one or more of chlorine, arsenic, or phosphorus. Though other dopants may be used to provide the functionality described below.

Figures 2C, 2D:
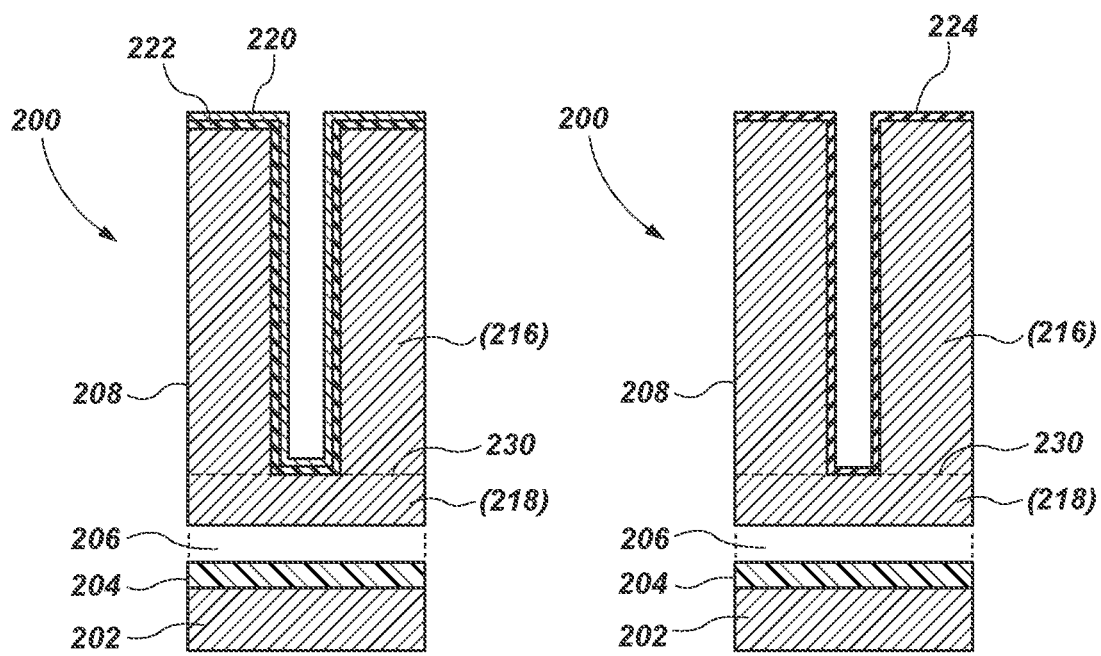

As depicted in FIG. 2C, an optional adhesion material, such as titanium nitride (TiN), which may be in the form of a conformal layer 222, may be formed within trench 210 before forming the doped silicon-containing material 220. Such a TiN layer can promote adhesion between subsequently deposited or formed materials and the surrounding dielectric or other material.

In selected examples, silicon-containing material 220 is formed as a generally conformal layer within trench 210. In some examples, silicon-containing material can be deposited in a manner to also deposit the dopant within the material; while in other examples silicon may first be deposited, and subsequently doped. For either of these alternatives, an atomic layer deposition (ALD) or a CVD process may be used to deposit silicon-containing material (with or without the dopant). The CVD deposition may be performed as a single stage deposition or as a multiple stage deposition (as with the ALD deposition), as known to persons skilled in the art.

Addressing first the alternative in which silicon-containing material is deposited as a doped material, CVD deposition of a doped silicon material may be performed by providing multiple precursors, of which at least one includes the dopant. For example, CVD deposition of chlorine-doped silicon may be performed through use of precursors including disilane ($Si_2H_6$) and dichlorosilane ($H_2CL_2Si$). In some examples, the precursors may be alternated through a limited number of cycles (for example, five cycles or fewer, and in some cases just two cycles).

As example process conditions for such CVD or ALD deposition, the deposition may be performed at a temperature range within 300 to 500 degrees centigrade, and at pressures ranging from 1n Torr to 10 Torr. In some examples, the precursors may be supplied in amounts to provide chlorine dopant at a level within the range of 0.001% to 10%. In some examples, a dopant concentration within the range of about 0.05% to about 2% may be satisfactory; with a dopant concentration within the range of 0.1 to about 0.5% commonly appropriate; for example, about 0.02% (or about ~1E20 atoms/$cm^3$), in some implementations may be appropriate.

For many examples, the doped silicon may be deposited to a thickness within 10 to 50 Ångströms. The dopant is selected to promote the forming of beta-phase tungsten as a seed layer as a result of the described reduction process. A predominantly beta-phase tungsten seed layer including the material of the dopant is configured to inhibit nucleation when a subsequent tungsten fill is performed on the seed layer, and thus promotes formation of a tungsten fill that is predominantly alpha-phase (i.e., over 50 percent by volume), and further promotes formation of relatively larger grains in the tungsten fill. While not wishing to be bound by theory, it appears that the nucleation inhibition of the beta-phase tungsten leads to sparse nucleation of alpha-phase tungsten on the beta-phase tungsten, therefore allowing the alpha-phase grains to "bloom" to larger sizes than those obtained through conventional deposition processes.

Addressing the second alternative, in which silicon is deposited, and subsequently doped, the silicon may be deposited through use of a disilane precursor ($Si_2H_6$). In other examples, as an alternative, the precursor may include silane ($SiH_4$), or potentially other silicon-containing precursors. In many examples, the deposition would again be to a thickness of about 10 to 50 Ångströms. Subsequently, the deposited silicon may be doped with a suitable dopant, which may be, for example, any one or more of chlorine, arsenic, and phosphorus. Doping levels for chlorine were discussed earlier herein. In some examples, arsenic and phosphorus may be doped, for example, at doping levels within the ranges as described above for chlorine. While doping the silicon after deposition will be suited for some applications, it is currently contemplated that as feature dimensions decrease and/or aspect ratios of recesses increase, doping the silicon as deposited will provide additional advantages in uniformity of doping of the silicon. When the silicon is doped after deposition, the doping may be by any suitable means known to persons skilled in the art, for example ion implantation.

In many applications, the thickness of the deposited silicon is limited to thicknesses as discussed above, because the silicon will be reduced to beta-phase tungsten. Beta-phase tungsten is desirable for reducing nucleation of a subsequently deposited alpha-phase tungsten fill but has substantially higher resistivity (for example, in some implementations, approximately 3 to 10 times greater resistivity) that that of alpha-phase tungsten. As a result, relatively higher ratios of the volume of alpha phase tungsten to beta phase tungsten result in tungsten structures with lower resistivity. As result, reducing the dimensions of beta-phase tungsten seed layer as much as possible (in view of competing factors of process complexity, costs, etc.), while maintaining the nucleation-inhibiting property of the tungsten seed layer is advantageous.

Referring now to FIG. 2D, once the doped silicon-containing film is formed, it will be converted (i.e., reduced) to tungsten 224. The dopants in the silicon-containing film are selected to promote the formation of beta-phase tungsten, as described above. Such reduction of the silicon film can be performed by exposure of the film to tungsten hexafluoride (WF6), typically in the presence of hydrogen (H2), under suitable conditions. For example, for a silicon film 10 to 50 Ångströms thick, exposure of the silicon to WF6 at (in some examples) between 30 and 50 Torr, for example about 40 Torr, at between about 350° C. and 425° C. (for example about 395° C.), with a ratio of WF6 to H2 of 0.0001 to 100.0 for about 20 to 30 seconds can be satisfactory. During the reduction process, the silicon atoms are replaced by the tungsten atoms, and the reaction product, silicon tetrafluoride (SiF4) is removed from the chamber. The reduction of the silicon-containing film is self-limiting. However, silicon-containing films of up to 2000 Angstroms have been reduced to tungsten. Thus, process conditions may be implemented to result in essentially all silicon of the silicon-containing material of a thinner film, as described above, being reduced to tungsten.

The ratio of alpha phase tungsten to beta phase tungsten in the tungsten fill is dependent on the deposition conditions and the underlying layer on which the tungsten is deposited (in the present examples the tungsten seed layer). The same considerations discussed above also impact avoiding higher resistance amorphous phase tungsten in the tungsten fill to the extent possible.

The relatively lower resistance of the alpha phase tungsten is enhanced with a larger grain size, as discussed above, as compared with tungsten fill material as would be formed in the absence of the doped or alloyed tungsten seed layer. While the tungsten seed layer itself has relatively increased resistance due to its predominantly beta phase composition, this additional resistance is offset by the lower resistance of the larger grain size, predominantly alpha phase tungsten fill, which forms the majority of the conductive structure. The resistance of such tungsten fill material in the recesses is thus relatively low (for example, on the order of 2-4 Ω/sq for about a 20 nm wide deposition that is 65-100 nm in depth) compared with alpha phase tungsten fill typically deposited without the seed layer (which may be, for example, >5 Ω/sq for a similar structure).

The CVD process used to deposit the tungsten fill material in the recesses (or on other support surfaces) may use tungsten hexafluoride (WF6); and may be run at a temperature of 200-500° C. or more specifically between about 375° C. and 425° C., or about 395° C. The CVD process may use a high-power long-throw plasma of about 4-40 kW for about 10-100s. The chamber pressure for bulk CVD deposition of tungsten to increase the tungsten grain size may be in a range, for example, of about 30 Torr and about 50 Torr, for example 40 Torr, though higher or lower pressures may also be utilized.

The CVD process for depositing the tungsten fill material may alternatively comprise a variety of processes such as diborane ($B_2H_6$) based nucleation and/or silane ($SiH_4$) based nucleation, for example. In such an example, the CVD process may include bulk deposition or pulsed nucleation. A diborane ($B_2H$) nucleation cycle for the CVD deposition process includes a diborane ($B_2H_6$) soak, tungsten fluoride ($WF_6$) dose followed by $B_2H_6/WF_6$ pulses. Such a nucleation cycle may be repeated in a range of 1 to 20 times or between 1 and 4 times. Conditions for a silane ($SiH_4$) based nucleation cycle for the CVD tungsten process includes a silane ($SiH_4$) soak, tungsten fluoride ($WF_6$) dose followed by $SiH_4/WFs$ pulses. This nucleation cycle may be repeated in a range of 1 to 20 times or more particularly between 3 and 5 times. In some embodiments, a diborane or silane nucleation temperature range may be between about 250° C. and 350° C., with the chamber temperature and pressure ranges mirroring the above.

Figure 2E:
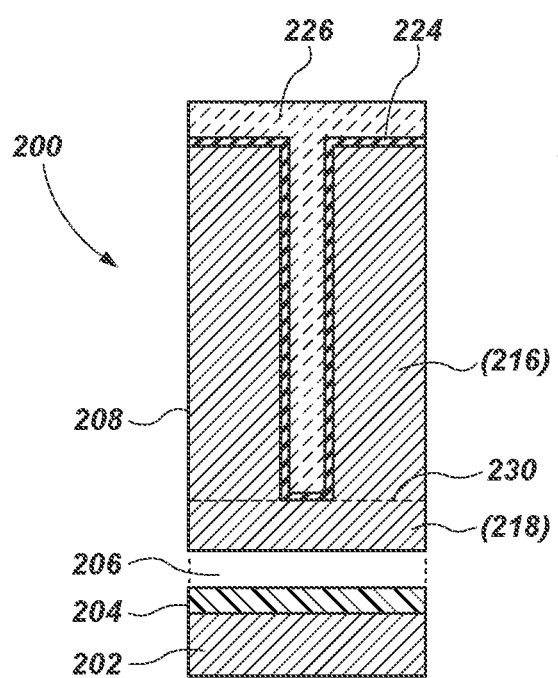
Figure 2F:
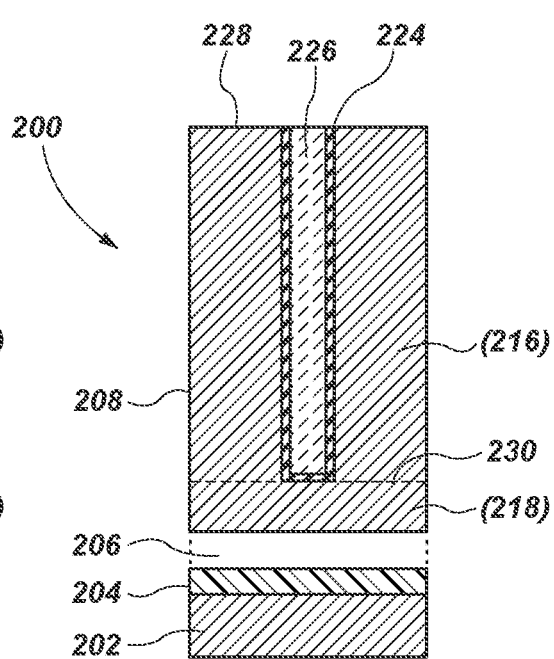

After the tungsten fill material 210 has been deposited, the structure may be planarized to form a planar upper surface 228, as shown in FIG. 2F. In some embodiments, both the seed layer 208 and the tungsten fill material 210 may be removed from locations outside the recesses 206 (as depicted). CMP or another planarization technique may be used to remove the layers. In some embodiments, such as that depicted, the resulting conductive structures (recesses filled with the seed layer 208 and the tungsten fill material 210) are electrically isolated by the surrounding dielectric level 208. The resulting structure 200 may be used in assembly of a variety of devices, such as a memory device word line, a bit line, NAND gates, and/or interconnect features for memory, logic, or other types of devices.

Figure 3:
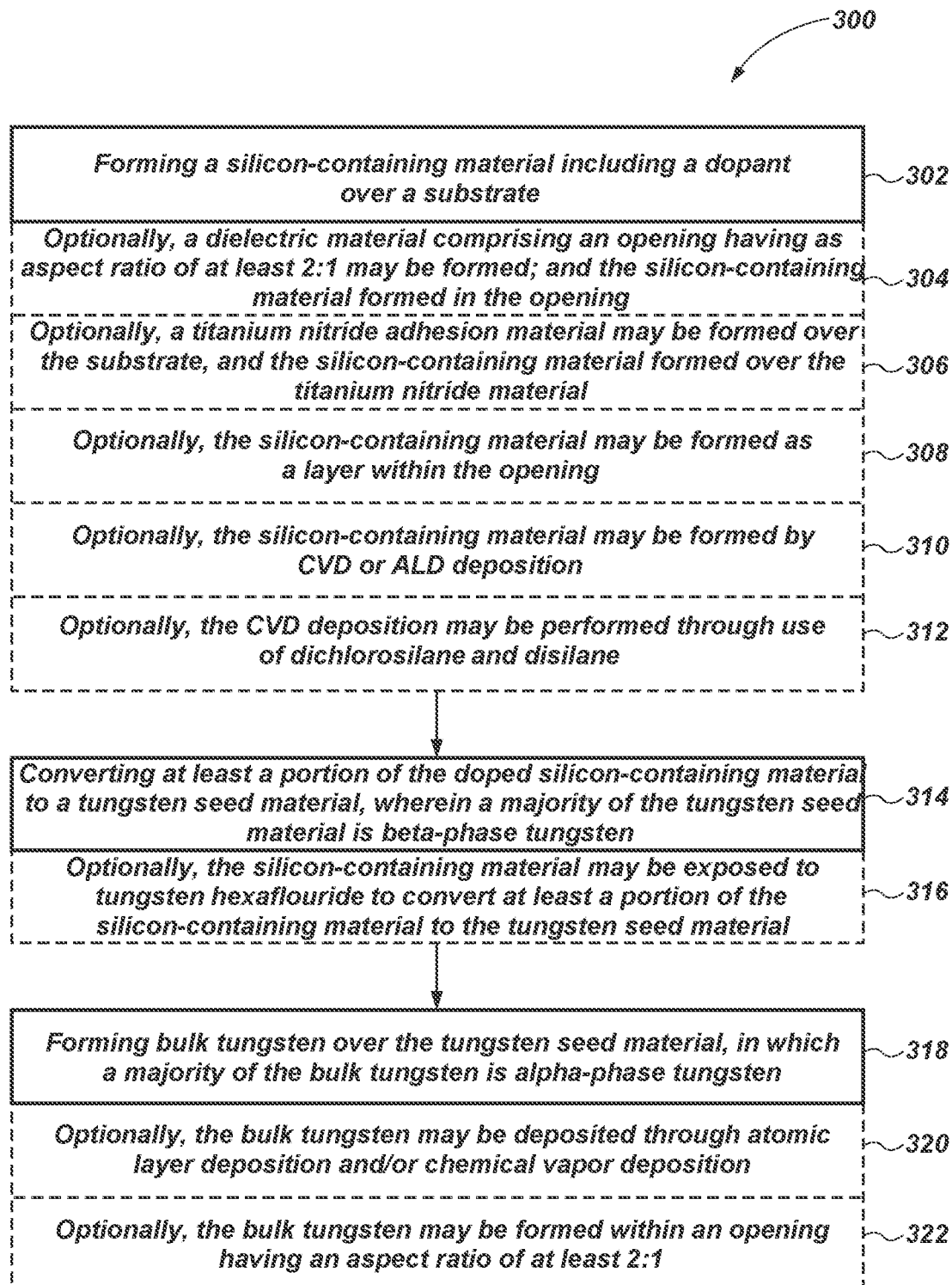
FIG. 3 depicts a flowchart of an example manufacturing process (including optional operations and variations) for forming tungsten structures such as the conductive structures of FIGS. 1 and 2A-F.

In accordance with the preceding description, FIG. 3 depicts an example process flow 300. Example process flow 300 includes optional operations or alternatives, shown within boxes defined by dashed lines. As previously described, example process flow 300 includes, at 302, forming a silicon-containing material including a dopant over a substrate. Optionally, as indicated in 304 (and as described above relative to FIGS. 2A-C), the substrate may include a dielectric level defining an opening (or "recess") in which the silicon-containing material will be formed, and in which the opening has an aspect ratio of at least 2:1.

As indicated at 306, optionally a titanium nitride adhesion material may be formed over the substrate (such as within a recess), and the silicon-containing material formed over the titanium nitride material (as previously discussed relative to FIG. 2C). As indicated at 308, in some examples the silicon containing material will be formed as a layer, which may in some examples be a generally conformal layer, within an opening. As indicated at 310, optionally the silicon-containing material may be formed by CVD or ALD deposition; which as indicated at 312, can optionally be performed through use of dichlorosilane and disilane. As discussed previously in reference to FIG. 2B, the silicon-containing material can be formed through CVD or ALD deposition, and can either be doped as deposited, or doped subsequent to such CVD or ALD deposition.

As indicated at 314, at least a portion of the doped silicon-containing material will be converted to a tungsten seed material, in which a majority of the tungsten of the tungsten seed material is beta-phase tungsten (as previously discussed relative to FIG. 2D). Optionally, as indicated at 316, the silicon-containing material may be exposed to tungsten hexafluoride (potentially in combination with H2) to convert (at least) the portion of the silicon-containing material to the tungsten seed material. As previously discussed in many examples, essentially all silicon in the doped silicon-containing material will be converted to tungsten.

As indicated at 318, bulk tungsten will then be formed over the tungsten seed material, in which a majority of the bulk tungsten is alpha-phase tungsten, as discussed relative to FIG. 2E. As indicated 320, optionally, the bulk tungsten will be deposited through atomic layer deposition and/or chemical vapor deposition. And again, optionally, the bulk tungsten will be formed within an opening having an aspect ratio of at least 2:1. Once the predominantly alpha-phase bulk tungsten is formed, subsequent processing may be performed on the substrate structure as needed. For example, excess bulk tungsten may be removed from upper horizontal surfaces of dielectric forming the recesses (when present) such as through chemical mechanical planarization (or other removal processes). And additional levels and structures may be formed on the underlying structure.

To further clarify the described subject matter, the following individual Examples are included.

Example 1 is a method of forming a multilayer structure, the method comprising: forming a silicon-containing material over a substrate, the silicon-containing material including a dopant; converting at least a portion of the silicon-containing material to a tungsten seed material in which a majority of the tungsten seed material is beta-phase tungsten; and forming a tungsten fill over the tungsten seed material, wherein a majority of the tungsten of the tungsten fill is alpha phase tungsten, and a majority of the tungsten fill has a grain size having a maximum dimension of at least 80 nm.

In Example 2, the subject matter of Example 1 optionally includes forming a dielectric material having an opening therein, the opening having a ratio of height to width of at least 2:1 relative to at least one axis, and forming at least a portion of the silicon-containing material within the opening.

In Example 3, the subject matter of any one or more of Examples 1-2 optionally include forming titanium nitride over the substrate, and forming the silicon-containing material over the titanium nitride.

In Example 4, the subject matter of any one or more of Examples 2-3 optionally include forming titanium nitride within the opening, and forming the silicon-containing material over the titanium nitride.

In Example 5, the subject matter of any one or more of Examples 1-4 wherein forming the silicon-containing material comprises depositing the silicon-containing material concurrently with the dopant of the silicon-containing material.

In Example 6, the subject matter of any one or more of Examples 1-5 wherein forming the silicon-containing material comprises depositing a silicon-containing material and doping the deposited silicon-containing material with the dopant.

In Example 7, the subject matter of Example 6 optionally includes wherein forming the silicon-containing material is performed through chemical vapor deposition using a precursor comprising silicon and hydrogen.

In Example 8, the subject matter of any one or more of Examples 1-7 wherein forming the silicon-containing material is performed at least in part through chemical vapor deposition (CVD).

In Example 9, the subject matter of any one or more of Examples 5-8 wherein forming the silicon-containing material and the dopant is performed through chemical vapor deposition (CVD) using a disilane precursor, and a second precursor including the dopant material.

In Example 10, the subject matter of Example 9 optionally includes wherein the dopant comprises chlorine.

In Example 11, the subject matter of any one or more of Examples 9-10 wherein the chemical vapor deposition further comprises use of dichlorosilane.

In Example 12, the subject matter of any one or more of Examples 1-11 wherein the dopant comprises one or more of chlorine, arsenic, and phosphorus.

In Example 13, the subject matter of any one or more of Examples 1-12 wherein a majority of the tungsten seed layer is beta phase tungsten.

In Example 14, the subject matter of any one or more of Examples 1-13 wherein converting at least a portion of the silicon-containing material comprising a dopant to tungsten comprises reducing the silicon-containing material through exposure to a gas comprising tungsten.

In Example 15, the subject matter of Example 14 optionally includes wherein the gas comprising tungsten comprises tungsten hexafluoride.

In Example 16, the subject matter of any one or more of Examples 1-15 wherein the tungsten seed material and the tungsten fill material form a conductive line over the semiconductor substrate.

In Example 17, the subject matter of Example 16 optionally includes wherein the tungsten seed material and the tungsten fill material form a data line of a memory device.

In Example 18, the subject matter of any one or more of Examples 1-17 wherein the tungsten seed material and the tungsten fill material form a vertically-extending contact over the semiconductor substrate.

In Example 19, the subject matter of any one or more of Examples 1-18 silicon-containing material is formed with a thickness of 50 Angstroms or less.

In Example 20, the subject matter of any one or more of Examples 2-19 wherein the tungsten seed material and the tungsten fill together fill the recess in the dielectric material.

In Example 21, the subject matter of any one or more of Examples 1-20 optionally include performing depositing the tungsten fill at a temperature of at least 300° C. after deposition of the silicon-doped tungsten seed layer.

In Example 22, the subject matter of Example 210 ptionally includes wherein the tungsten fill is deposited by chemical vapor deposition (CVD).

In Example 23, the subject matter of any one or more of Examples 1-22 wherein the tungsten fill forms a conductive line having a vertical cross-section in a plane perpendicular to the length of the line, wherein the vertical cross-section of the tungsten fill has a ratio of height to width of at least 2:1.

In Example 24, the subject matter of Example 23 vertical cross-section of the tungsten fill has a ratio of height to width of at least 20:1.

In Example 25, the subject matter of any one or more of Examples 23-24 wherein the vertical cross-section of the tungsten fill has a ratio of height to width of at least 50:1.

Example 26 is a multilayer structure, comprising: a first dielectric level formed on a substrate of a microelectronic device; a second dielectric level disposed on the first dielectric level, the second dielectric level comprising recesses formed therein, at least some of the recesses extending to the first dielectric level; a tungsten seed layer comprising tungsten and an additional material; and a tungsten fill disposed on the seed layer and filling the recesses in which the tungsten seed layer is present, the majority of the tungsten in the tungsten fill comprising alpha phase tungsten having a grain size with a maximum dimension of at least about 80 nm.

In Example 27, the subject matter of Example 26 optionally includes wherein a majority of the tungsten of the tungsten seed layer is beta phase tungsten.

In Example 28, the subject matter of any one or more of Examples 1-27 wherein the tungsten seed material and the tungsten fill material to form a source line over the semiconductor substrate.

In Example 29, the subject matter of any one or more of Examples 1-28 at least 50% of the tungsten fill material has a grain size with a maximum dimension of at least about 100 nm.

In Example 30, the subject matter of any one or more of Examples 26-29 wherein a resistivity of the tungsten seed material is higher than that of the tungsten fill material.

Example 31 is a memory device, comprising: a dielectric level comprising recesses; a tungsten seed layer disposed in the recesses, the tungsten seed layer including a material in addition to tungsten; and a tungsten fill material disposed in the recesses on the tungsten seed layer, wherein a majority of the tungsten seed layer is beta-phase tungsten, and wherein a majority of the tungsten fill material is alpha-phase tungsten having a grain size with a maximum dimension of at least 50 nanometers.

In Example 32, the subject matter of Example 31 wherein at least 50% of the tungsten fill material has a grain size with a maximum dimension of at least about 100 nm.

In Example 33, any of the individual operations or characteristics of the methods of Examples 1-25 may be incorporated with other of such Examples.

In Example 34, any of the methods of Examples 1-25 and 33 may be used to manufacture multilayer structures as identified in an Examples 26-30; or to manufacture memory devices as in Examples 31-32.

In Example 35, any of the multilayer structures of Examples 26-30 can incorporate additional structures or characteristics as identified in any of the methods of Examples 1-25 and 33.

In Example 36, any of the memory devices of Examples 31-32 may further include structures or characteristics as set forth in any of the methods of Examples 1-25 and 33.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this description, prepositions such as "on," "over," and "under" are defined with respect to the conventional plane or surface being on the top or exposed surface of the substrate, regardless of the orientation of the substrate; and while "on" is intended to identify a direct contact of one structure with another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." In the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

We claim:

1. A method of forming a multilayer structure, the method comprising:

forming a silicon-containing material over a substrate, the silicon-containing material including a dopant;

converting at least a portion of the silicon-containing material to a tungsten seed material in which a majority of the tungsten seed material is beta-phase tungsten; and forming a tungsten fill over the tungsten seed material, wherein a majority of the tungsten of the tungsten fill is alpha phase tungsten, and a majority of the tungsten fill has a grain size having a maximum dimension of at least 80 nm.

2. The method of claim 1, further comprising forming a dielectric material having an opening therein, the opening having a ratio of height to width of at least 2:1 relative to at least one axis, and forming at least a portion of the silicon-containing material within the opening.

3. The method of claim 2, further comprising forming titanium nitride within the opening, and forming the silicon-containing material over the titanium nitride.

4. The method of claim 1, wherein forming the silicon-containing material comprises depositing the silicon-containing material concurrently with the dopant of the silicon-containing material.

5. The method of claim 4, wherein forming the silicon-containing material and the dopant is performed through chemical vapor deposition (CVD) using a disilane precursor, and a second precursor including the dopant.

6. The method of claim 5, wherein the dopant comprises chlorine.

7. The method of claim 5, wherein the chemical vapor deposition further comprises use of dichlorosilane.

8. The method of claim 1, wherein forming the silicon-containing material comprises depositing a silicon-containing material and doping the deposited silicon-containing material with the dopant.

9. The method of claim 8, wherein forming the silicon-containing material is performed through chemical vapor deposition using a precursor comprising silicon and hydrogen.

10. The method of claim 1, wherein forming the silicon-containing material is performed at least in part through chemical vapor deposition (CVD).

11. The method of claim 1, wherein the dopant comprises one or more of chlorine, arsenic, and phosphorus.

12. The method of claim 1, wherein a majority of the tungsten seed layer is beta phase tungsten.

13. The method of claim 1, wherein converting at least a portion of the silicon-containing material comprising a dopant to tungsten seed material comprises reducing the silicon-containing material through exposure to a gas comprising tungsten.

14. The method of claim 13, wherein the gas comprising tungsten comprises tungsten hexafluoride.

15. The method of claim 1, wherein the tungsten seed material and the tungsten fill material form a conductive line over the semiconductor substrate.

16. The method of claim 1, wherein the tungsten fill forms a conductive line having a vertical cross-section in a plane perpendicular to the length of the line, wherein the vertical cross-section of the tungsten fill has a ratio of height to width of at least 2:1.

17. The method of claim 16, wherein the vertical cross-section of the tungsten fill has a ratio of height to width of at least 20:1.

18. The method of claim 1, wherein the tungsten seed material and the tungsten fill material form a source line over the semiconductor substrate.

19. The method of claim 1, wherein at least 50% of the tungsten fill material has a grain size with a maximum dimension of at least about 100 nm.

20. A multilayer structure, comprising:
a first dielectric level formed on a substrate of a microelectronic device;
a second dielectric level disposed on the first dielectric level, the second dielectric level comprising recesses formed therein, at least some of the recesses extending to the first dielectric level;
a tungsten seed layer comprising tungsten and an additional material; and
a tungsten fill disposed on the seed layer and filling the recesses in which the tungsten seed layer is present, the majority of the tungsten in the tungsten fill comprising alpha phase tungsten having a grain size with a maximum dimension of at least about 80 nm.

21. The multilayer structure of claim 20, wherein a majority of the tungsten of the tungsten seed layer is beta phase tungsten.

22. The multilayer structure of claim 20, wherein a resistivity of the tungsten seed material is higher than that of the tungsten fill material.

23. A memory device, comprising:
a dielectric level comprising recesses;
a tungsten seed layer disposed in the recesses, the tungsten seed layer including a material in addition to tungsten; and
a tungsten fill material disposed in the recesses on the tungsten seed layer,
wherein a majority of the tungsten seed layer is beta-phase tungsten, and
wherein a majority of the tungsten fill material is alpha-phase tungsten having a grain size with a maximum dimension of at least 50 nanometers.

24. The memory device of claim 23, comprising wherein at least 50% of the tungsten fill material has a grain size with a maximum dimension of at least about 100 nm.

* * * * *